(12) United States Patent
Mizuguchi

(10) Patent No.: US 11,591,713 B2
(45) Date of Patent: Feb. 28, 2023

(54) ALUMINUM OXIDE, METHOD FOR MANUFACTURING ALUMINUM OXIDE AND OPTICAL COMPONENT

(71) Applicant: NIKON CORPORATION, Tokyo (JP)

(72) Inventor: Masafumi Mizuguchi, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 1162 days.

(21) Appl. No.: 16/144,619

(22) Filed: Sep. 27, 2018

(65) Prior Publication Data

US 2019/0024258 A1  Jan. 24, 2019

Related U.S. Application Data

(63) Continuation of application No. PCT/JP2016/060458, filed on Mar. 30, 2016.

(51) Int. Cl.
*C30B 29/20* (2006.01)
*G02B 5/30* (2006.01)
*C30B 33/02* (2006.01)

(52) U.S. Cl.
CPC .............. *C30B 29/20* (2013.01); *C30B 33/02* (2013.01); *G02B 5/30* (2013.01); *G02B 5/3083* (2013.01)

(58) Field of Classification Search
CPC ........ C30B 29/20; C30B 33/02; G02B 5/3083
See application file for complete search history.

(56) References Cited

U.S. PATENT DOCUMENTS

| | | | |
|---|---|---|---|
| 6,057,970 A | 5/2000 | Kim et al. | |
| 6,456,643 B1 * | 9/2002 | Osmanow | H01S 3/09716 372/86 |
| 2004/0177802 A1 | 9/2004 | Sprenger et al. | |
| 2012/0015799 A1 | 1/2012 | Shonai | |
| 2015/0104376 A1 * | 4/2015 | Turchetti | C30B 29/20 423/625 |
| 2015/0267321 A1 * | 9/2015 | Lee | C30B 29/20 432/245 |

FOREIGN PATENT DOCUMENTS

| | | | |
|---|---|---|---|
| CN | 1266112 A | 9/2000 | |
| CN | 1743514 A | 3/2006 | |
| CN | 104451890 | 3/2015 | |
| JP | 5-47636 | 2/1993 | |
| JP | 11-354432 | 12/1999 | |
| JP | 2004-256388 | 9/2004 | |
| JP | 2005-289693 | 10/2005 | |
| JP | 2006-327876 | 12/2006 | |
| JP | 2016-98139 | 5/2016 | |
| WO | WO-2007123093 A1 * | 11/2007 | ............. C30B 19/12 |
| WO | WO 2011/001905 A1 | 1/2011 | |
| WO | WO 2011/065403 A1 | 6/2011 | |

OTHER PUBLICATIONS

Extended European Search Report dated Oct. 1, 2019 in corresponding European Patent Application No. 16896862.6.

(Continued)

*Primary Examiner* — Prashant J Khatri

(57) ABSTRACT

Aluminum oxide provides, at a thickness of 5 mm, an internal transmittance of 90% or higher for light at a wavelength of 193 nm.

14 Claims, 4 Drawing Sheets

(56) References Cited

OTHER PUBLICATIONS

Notification of the Third Office Action dated Aug. 18, 2021, in Chinese Patent Application No. 201680083998.3.
Communication pursuant to Article 94(3) EPC dated Sep. 9, 2021, in European Patent Application No. 16896862.6.
Chinese Office Action dated May 7, 2020 in Chinese Patent Application No. 201680083998.3.
Kawaminami et al., "Crystal Growth of Large Sapphire and its Optical Properties", Journal of the Ceramic Society of Japan, June 3, 2014, vol. 122, No. 8, pp. 695-700.
Zhou et al., "Φ140mm Sapphire Crystal Growth by Temperature Gradient Techniques and its Color Centers", Materials Letters No. 60, Apr. 2006, pp. 901-904.
International Search Report dated Jun. 28, 2016 in corresponding International Patent Application No. PCT/JP2016/060458.
Chinese Office Action dated Mar. 18, 2021, in corresponding Chinese Patent Application No. 201680083998.3.
Taiwanese Office Action dated Sep. 2, 2020, in corresponding Taiwanese Patent Application No. 106102125.
Notice of Reasons for Refusal dated Sep. 29, 2020, in corresponding Japanese Patent Application No. 2019-197182.
Rejection Decision, dated Jan. 17, 2022, in Chinese Patent Application No. 201680083998.3 (10 pp.).

\* cited by examiner

ALUMINUM OXIDE, METHOD FOR MANUFACTURING ALUMINUM OXIDE AND OPTICAL COMPONENT

INCORPORATION BY REFERENCE

This application is a continuation of international application No. PCT/JP2016/060458 filed Mar. 30, 2016.

The disclosure of the following priority application is herein incorporated by reference: International application No. PCT/JP2016/060458 filed Mar. 30, 2016.

BACKGROUND ART

1. Technical Field

The present invention relates to aluminum oxide, a method for manufacturing aluminum oxide and an optical component.

2. Description of Related Art

The use of sapphire (α-type aluminum oxide (α-alumina), chemical formula: $Al_2O_3$), having an absorption band for light in the ultraviolet range, in some optical component applications has been limited in the past. International patent publication WO/2011/001905 discloses a method for manufacturing sapphire that includes a step in which a sapphire ingot to undergo a machining process is heated in an atmosphere containing oxygen. However, it does not provide any suggestion for an improvement that may be made with regard to the absorption in the ultraviolet range.

SUMMARY

According to the first aspect of the present invention, aluminum oxide, provides, at a thickness of 5 mm, an internal transmittance of 90% or higher for light at a wavelength of 193 nm.

According to the second aspect of the present invention, in the aluminum oxide according to the first aspect, it is preferred that the internal transmittance achieved therein is 95% or higher.

According to the third aspect of the present invention, in the aluminum oxide according to the first or second aspect, it is preferred that a wavelength $\lambda_{80}$ of light for which an internal transmittance of 80% is achieved at a thickness of 5 mm is 170 nm or less.

According to the fourth aspect of the present invention, in the aluminum oxide according to the third aspect, it is preferred that the wavelength $\lambda_{80}$ is 150 nm or less.

According to the fifth aspect of the present invention, in the aluminum oxide according to any one of the first through fourth aspects, it is preferred that at a thickness of 5 mm, an average internal transmittance of light at wavelengths from 150 nm through 220 nm is 85% or higher.

According to the sixth aspect of the present invention, in the aluminum oxide according to the fifth aspect, it is preferred that the average internal transmittance is 90% or higher.

According to the seventh aspect of the present invention, a method for manufacturing aluminum oxide, comprises: a first heating step in which aluminum oxide is heated at a first temperature in an atmosphere containing oxygen; and a second heating step in which the aluminum oxide having been heated through the first heating step is heated at a second temperature in an atmosphere having fewer oxygen molecules per unit volume compared to a number of oxygen molecules per unit volume in the atmosphere used for the first heating step.

According to the eighth aspect of the present invention, in the method for manufacturing aluminum oxide according to the seventh aspect, it is preferred that the first temperature is 1600° C. or higher; and the second temperature is 1600° C. or higher.

According to the ninth aspect of the present invention, in the method for manufacturing aluminum oxide according to the seventh or eighth aspect, it is preferred that the first temperature is 1700° C. or higher; and the second temperature is 1800° C. or higher.

According to the tenth aspect of the present invention, in the method for manufacturing aluminum oxide according to any one of the seventh through ninth aspects, it is preferred that the number of oxygen molecules per unit volume in the atmosphere used for the second heating step is $1.0 \times 10^{18}/m^3$ or smaller.

According to the eleventh aspect of the present invention, in the method for manufacturing aluminum oxide according to any one of the seventh through tenth aspects, it is preferred that the first heating step is executed in the atmospheric pressure.

According to the twelfth aspect of the present invention, in the method for manufacturing aluminum oxide according to any one of the seventh through eleventh aspects, it is preferred that the pressure in the atmosphere used for the second heating step is lower than the pressure in the atmosphere used for the first heating step.

According to the thirteenth aspect of the present invention, in the method for manufacturing aluminum oxide according to any one of the seventh through twelfth aspects, it is preferred that the pressure in the atmosphere used for the second heating step is 100 Pa or lower.

According to the fourteenth aspect of the present invention, in the method for manufacturing aluminum oxide according to any one of the seventh through thirteenth aspects, it is preferred that the pressure in the atmosphere used for the second heating step is 0.1 Pa or lower.

According to the fifteenth aspect of the present invention, an optical component includes aluminum oxide according to any one of the first through sixth aspects.

According to the sixteenth aspect of the present invention, in the optical component according to the fifteenth aspect, it is preferred that a thickness of the aluminum oxide is 0.5 mm or less, and an internal transmittance of the aluminum oxide is 99% or higher for light with a wavelength of 193 nm.

DESCRIPTION OF EMBODIMENTS

Figure 1:
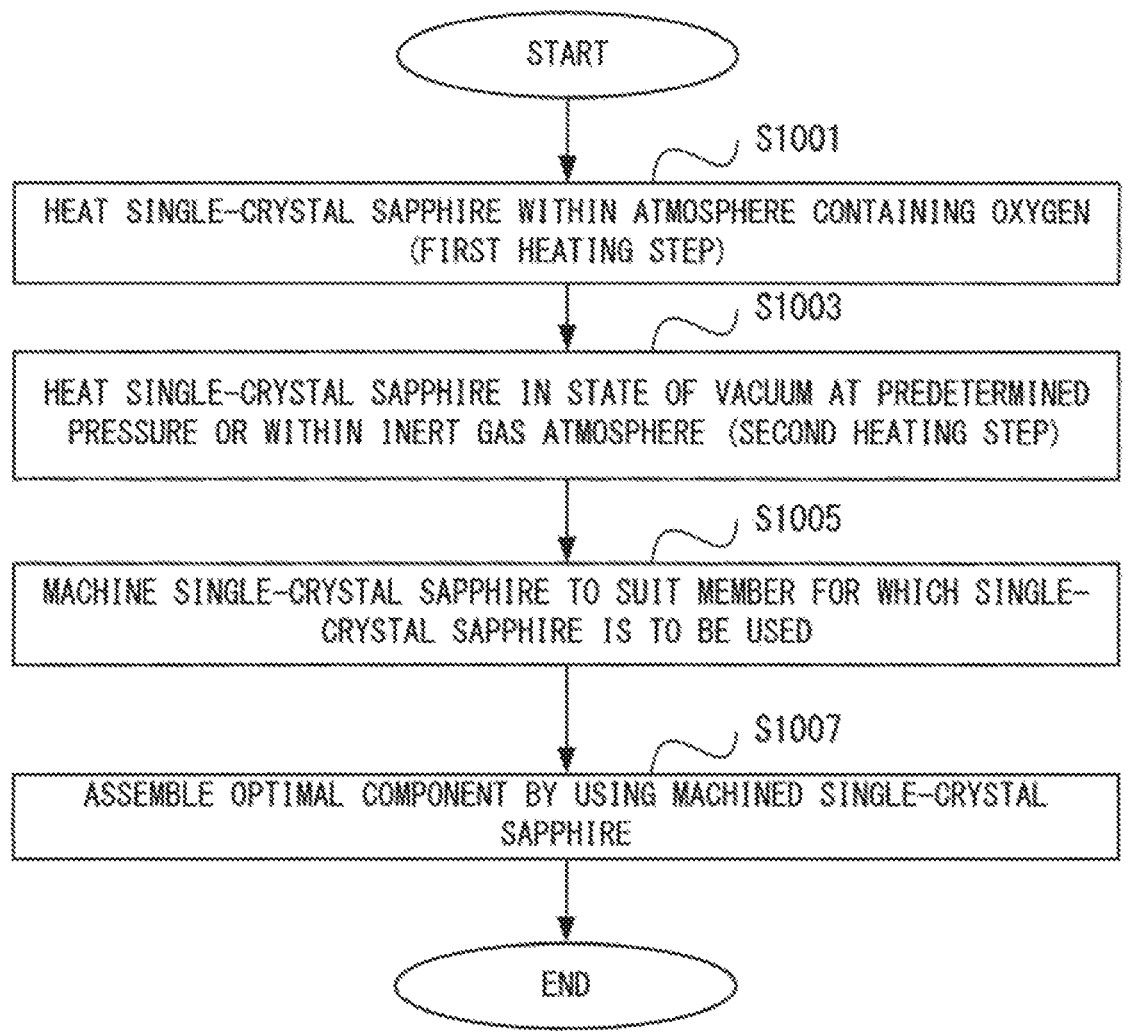
FIG. 1 is a flowchart indicating how an optical component may be manufactured by adopting the method for manufacturing a single-crystal sapphire achieved in an embodiment.

The following is a description, given in reference to drawings as needed, of the method for manufacturing aluminum oxide achieved in an embodiment, the aluminum oxide obtained through the present embodiment, an optical component that includes the aluminum oxide, and the like. It is to be noted that while an explanation will be given by assuming that the aluminum oxide achieved in the present embodiment is a single-crystal aluminum oxide and by referring to the aluminum oxide as a sapphire or a single-crystal sapphire, the aluminum oxide achieved through the present embodiment may be a polycrystal instead of a single-crystal. It is to be also noted that the term "sapphire" or "single-crystal sapphire" is used to refer to aluminum oxide with the α-type crystal system (α-alumina).

In the method for manufacturing a single-crystal sapphire achieved in the present embodiment, a single-crystal sapphire is heated in a plurality of different atmospheres so as to improve the internal transmittance and other properties of the single-crystal sapphire, with regard to light in the ultraviolet range. The method for manufacturing a single-crystal sapphire in the present embodiment comprises a step in which a single-crystal sapphire is heated in an atmosphere containing oxygen (hereafter to be referred to as a first heating step) and a step in which the single-crystal sapphire having been heated through the first heating step is heated in an atmosphere containing fewer oxygen molecules per unit volume than the number of oxygen molecules per unit volume in the atmosphere used in the first heating step (hereafter to be referred to as a second heating step).

It is to be noted that the single-crystal sapphire having undergone the first heating step may be cooled down to room temperature before it undergoes the second heating step, or the single-crystal sapphire may undergo the second heating step subsequently after the first heating step without being cooled down to room temperature.

A single-crystal sapphire is usually manufactured by gradually cooling melted aluminum oxide with an extremely high temperature so as to grow a crystal. In order to prevent oxidation of the furnace during this process, the crystal is grown in an atmosphere having a sufficiently low oxygen concentration. As a result, oxygen vacancies are formed in the single-crystal sapphire grown through this process and the single-crystal sapphire will have an absorption band for light at wavelengths around 200 nm due to the oxygen vacancies.

In the present embodiment, a single-crystal sapphire is first heated in an atmosphere containing oxygen and then it is heated in an atmosphere with fewer oxygen molecules per unit volume. As a result, a single-crystal sapphire with no haze, achieving a high internal transmittance of light with a wavelength of around 200 nm, can be obtained.

It is preferred that the single-crystal sapphire, obtained through the present embodiment achieve, at a thickness of 5 mm, an internal transmittance of 90% or higher for light having a wavelength of 193 nm, or better yet, for the single-crystal sapphire to achieve, at a thickness of 5 mm, an internal transmittance of 95% or higher for light having a wavelength of 193 nm and it is even better, to achieve an internal transmittance of 98% or higher for light having a wavelength of 193 nm. It is preferred that the single-crystal sapphire obtained through the present embodiment achieve, at a thickness of 5 mm, a wavelength $\lambda_{80}$ at which an internal transmittance becomes 80% at the absorption edge of the ultraviolet range for light is 170 nm or less and it is even more preferable for the wavelength $\lambda_{80}$ to be 150 nm or less. It is preferred that the single-crystal sapphire obtained through the present embodiment achieve, at a thickness of 5 mm, an average internal transmittance of 85% or higher for light in the wavelength range between 150 nm and 220 nm, and it is still better for the average internal transmittance to be 90% or higher and even better for it to be 95% or higher.

In addition, an internal transmittance of 99% or higher can be achieved in the single-crystal sapphire obtained through the present embodiment by setting its thickness to 0.5 mm or less.

In the first heating step, the single-crystal sapphire is heated and oxygen is introduced into oxygen vacancies of the single-crystal sapphire through thermal diffusion of oxygen. An optimal length of time is set for the heating duration in the first heating step in correspondence to the size of the single-crystal sapphire undergoing the heat treatment. While no particular restrictions are imposed with regard to the temperature setting for the first heating step as long as the first heating step is executed at a temperature at which oxygen is introduced into oxygen vacancies of the single-crystal sapphire so as to reduce the oxygen vacancies within a desired time period, it is preferable to set the temperature at 1600° C. or higher, and more preferable at 1700° C. or higher or even more preferable at 1800° C. or higher. While it is preferable to maintain the temperature at a substantially constant level through the first heating step, no strict limitations are imposed in this regard and a predetermined temperature range may be set instead and control may be executed so as to maintain the heating temperature within the temperature range. It is preferable to set the temperature for the first heating step at a higher level, since oxygen vacancies can be reduced faster at a higher temperature. However, if the temperature for the first heating step is set at an excessively high level, the furnace for such a heating process will usually be oxidized and damaged more readily, which is unfavorable from the viewpoint of cost performance and the like.

The first heating step executed as described above, oxygen vacancies in the single-crystal sapphire are reduced and the internal transmittance can be improved. However, the inventor of the present invention discovered that visible haze occurs in the single-crystal sapphire having undergone only the first heating step. The inventor of the present invention, having deduced that the haze was caused by excess oxygen introduced into the single-crystal sapphire during the first heating step, addressed the haze issue by adding a second heating step, which will be described below.

In the second heating step, the single-crystal sapphire is heated in an atmosphere containing fewer oxygen molecules per unit volume compared to the number of oxygen molecules per unit volume contained in the atmosphere used in the first heating step. By placing the single-crystal sapphire in an atmosphere with fewer oxygen molecules per unit volume compared to the number of oxygen molecules per unit volume contained in the atmosphere used in the first heating step, the excess oxygen having been introduced into the single-crystal sapphire can be removed in a desirable manner. An optimal length of time is set for the heating duration in the second heating step in correspondence to the size of the single-crystal sapphire undergoing the heat treatment. While no particular restrictions are imposed with regard to the temperature setting for the second heating step as long as the second heating step is executed at a temperature at which the excess oxygen is removed from the inside of the single-crystal sapphire within a desired time period, it is preferable to set the temperature at 1600° C. or higher, and more preferable at 1700° C. or higher or even more preferable at 1800° C. or higher, and still more preferable at 1900° C. or higher. While it is preferable to maintain the temperature at a substantially constant level through the second heating step, no strict limitations are imposed in this regard and a predetermined temperature range may be set instead and control may be executed so as to maintain the heating temperature within the temperature range. It is preferable to set the temperature for the second heating step at a higher level to remove the excess oxygen faster. The second heating step is executed in an atmosphere with fewer oxygen molecules than the number of oxygen molecules per unit volume contained in the atmosphere used in the first heating step. This means that the furnace used for the second heating step is less readily oxidized even if the single-crystal sapphire is heated at a temperature higher than that set for the first heating step. Thus, the temperature for the second heating step can be set higher than the temperature for the first heating step in the method for manufacturing a single-crystal sapphire in the present embodiment. Consequently, a single-crystal sapphire with no haze, which assures higher transmittance of light at wavelengths around 200 nm can be manufactured within a shorter period of time.

It is to be noted that temperatures for the first heating step and the second heating step should both be set lower than the melting point of single-crystal sapphire.

In addition, it is preferred that the first heating step and the second heating step be executed in this order. If the first heating step were executed after the second heating step, oxygen having been introduced in excess would remain in the single-crystal sapphire and thus, the issue of haze would remain unaddressed. Under such circumstances, a procedure similar to the second heating step would have to be implemented again in order to remove the haze in the single-crystal sapphire.

The number of oxygen molecules per unit volume in the atmosphere used for the first heating step must be equal to or greater than a predetermined level in order to ensure that oxygen is introduced to oxygen vacancies inside the single-crystal sapphire. It is preferred that the number of oxygen molecules per unit volume in the atmosphere used for the first heating step be equal to or greater than $1.0 \times 10^{21}/m^3$, it is better yet to set it to $1.0 \times 10^{22}/m^3$ or more and it is still better to set it equal to or greater than $1.0 \times 10^{23}/m^3$. As an alternative, the partial pressure of oxygen may be used as an index for the number of oxygen molecules present in the atmosphere used for the first heating step. It is preferable to set the oxygen partial pressure for the first heating step to $1.0 \times 10^2$ Pa or higher, it is better yet to set it equal to or higher than $1.0 \times 10^3$ Pa and it is still better to set it to $1.0 \times 10^4$ Pa or higher. This means that the first heating step can be executed in a room air environment. The first heating step can be executed in the atmospheric pressure by using a less expensive furnace, since it will not be necessary to adjust the partial pressure of oxygen in the furnace.

The number of oxygen molecules per unit volume in the atmosphere used for the second heating step must be equal to or lower than a predetermined level in order to ensure that excess oxygen having been introduced into the single-crystal sapphire is removed. It is preferred that the number of oxygen molecules per unit volume in the atmosphere used for the second heating step be equal to or smaller than $1.0 \times 10^{18}/m^3$, it is better yet to set it to $1.0 \times 10^{17}/m^3$ or smaller and still better to set it equal to or smaller than $1.0 \times 10^{16}/m^3$. It is preferable to set the partial pressure of oxygen for the second heating step to 10 Pa or lower, it is even more preferable to set it to 1.0 Pa or lower, it is still better to set it to $1.0 \times 10^{-1}$ Pa or lower and it is even better to set it to $1.0 \times 10^{-2}$ Pa or lower. This means that the second heating step may be executed in an atmosphere in a state of medium vacuum (e.g., 100 Pa through 0.1 Pa) or in a state of high vacuum (e.g., 0.1 Pa through $10^{-5}$ Pa), achieved by evacuating the air inside the furnace. Thus, the manufacturing system can be configured without having to adjust the partial pressure of any specific gas. It is preferable to set the pressure in the atmosphere used for the second heating step to 100 Pa or lower, it is more preferable to set it to 10 Pa or lower, it is better still to set it to 1 Pa or lower and it is even better to set it to 0.1 Pa or lower. It is preferable to set the pressure in the atmosphere used for the second heating step lower than the pressure in the atmosphere used for the first heating step. It is to be noted that after setting the atmosphere inside the furnace in a state of vacuum, an inert gas may be charged into the furnace so as to reduce the number of oxygen molecules in the atmosphere in the furnace to a predetermined level or lower. In other words, the atmosphere in the furnace may be replaced with an inert gas, and no particular restrictions are imposed with regard to the pressure in the furnace after charging the inert gas as long as the number of oxygen molecules is set to a predetermined level or lower. Through the heat treatment executed in the atmosphere set for the first heating step and the heat treatment executed in the atmosphere set for the second heating step, as described above, a single-crystal sapphire assuring better internal transmittance of light at wavelengths around 200 nm can be obtained.

FIG. 1 presents a flowchart of optical component production executed by adopting the method for manufacturing a single-crystal sapphire in the present embodiment. The method for manufacturing a single-crystal sapphire achieved in the present embodiment includes a heat treatment through which a single-crystal sapphire is heated so as to obtain a single-crystal sapphire assuring better internal transmittance of light at wavelengths around 200 nm. The single-crystal sapphire yet to undergo the heat treatment may be a single-crystal sapphire ingot (hereafter to be referred to as a sapphire ingot 11) obtained through a method of crystal growth of the known art such as the Czochralski process, a sapphire optical material 12 obtained by machining the sapphire ingot 11, a sapphire substrate 13 obtained by further machining the sapphire optical material 12 resulting from the machining process, or the like. The sapphire ingot 11, the sapphire optical material 12 and the sapphire substrate 13 are collectively referred to as a single-crystal sapphire in this description. It is to be noted that the sapphire ingot 11 may be obtained through any of various methods of crystal growth of the known art other than the Czochralski process, including the Verneuil method, the EFG method, the Kyropoulos process and the Bagdasarov method.

Figure 2:
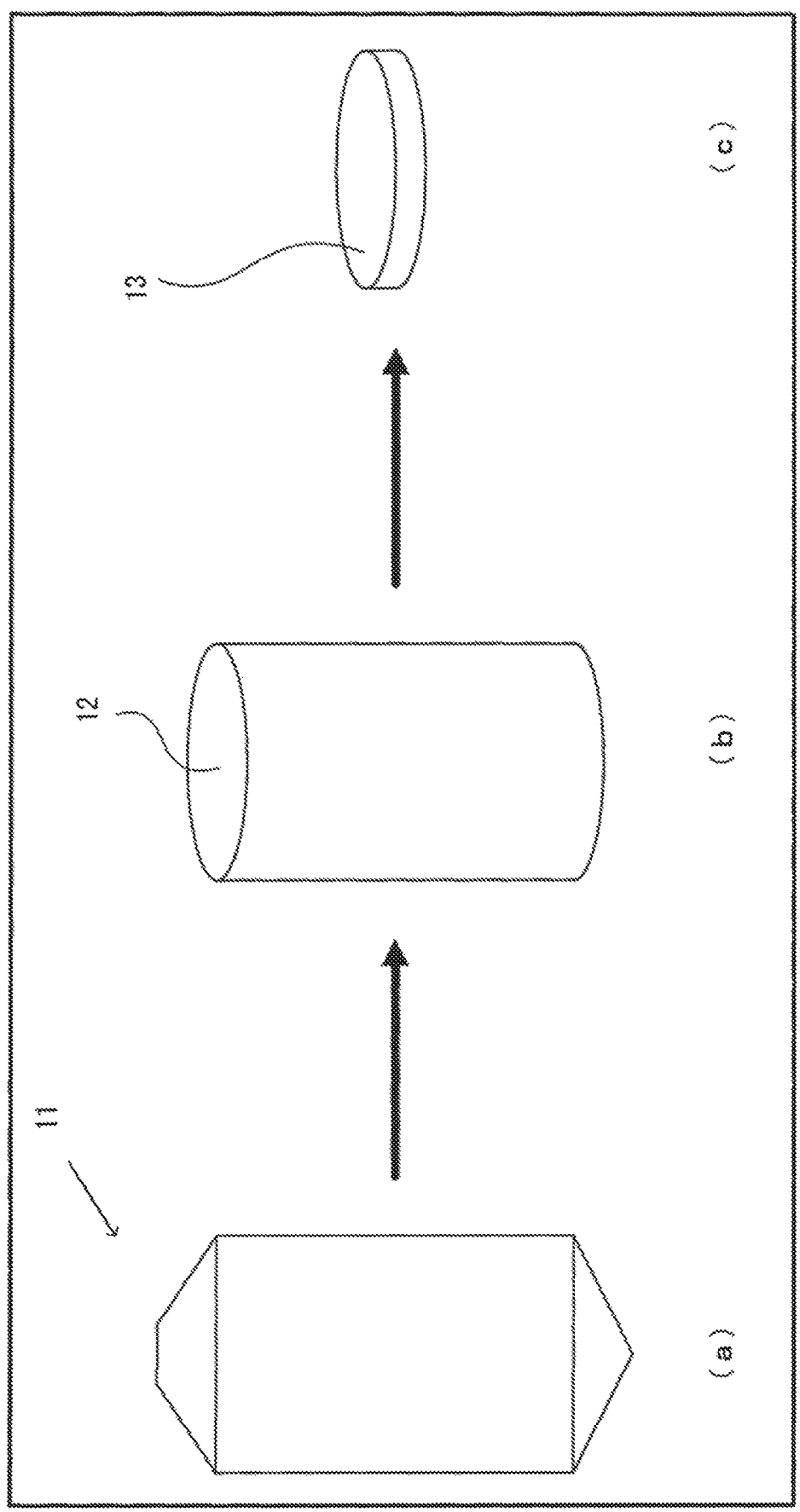
FIG. 2 shows illustrations presenting an example of a single-crystal sapphire machining process, with (a) showing a single-crystal sapphire as grown and (b) and (c) each showing a state of the single-crystal sapphire in (a) after it undergoes a machining step.

FIG. 2 illustrates a process through which the sapphire optical material 12 and the sapphire substrate 13 are obtained from the sapphire ingot 11. FIG. 2(a) shows a sapphire ingot 11 grown through a method of the known art. The sapphire ingot 11 is machined so as to manufacture a sapphire optical material 12 assuming, for instance, a cylindrical shape. FIG. 2(b) shows the sapphire optical material 12. The sapphire optical material 12 is further machined so as to obtain a sapphire substrate 13 with a thickness in the range of, for instance, several μm to several mm. FIG. 2(c) shows the sapphire substrate 13. No particular restrictions are imposed with regard to the crystal orientation such as in the sapphire optical material 12 or the sapphire substrate 13. The sapphire substrate 13 can be cut out from the sapphire optical material 12 so as to set, for instance, a C plane, an A plane, or an R plane of the single-crystal sapphire as the principal plane in correspondence to the specific intended purpose of use for the sapphire substrate.

A method for manufacturing an optical component by adopting the method for manufacturing a single-crystal sapphire achieved in the present embodiment will be described in reference to FIG. 1. Step S1001 is executed as the first heating step, in which the sapphire optical material 12, obtained from the sapphire ingot 11 grown through a method of crystal growth of the known art as described above, is heated in an atmosphere containing oxygen. While the atmosphere in the furnace where the single-crystal sapphire (sapphire optical material 12) is heated through the first heating step in step S1001 needs to contain oxygen, no particular restrictions are imposed with regard to gases other than oxygen. Namely, the atmosphere may be in the atmospheric pressure, or it may include at least one of gases such as nitrogen, carbon dioxide and argon, in addition to the oxygen. Once step S1001 is executed, the operation proceeds to step S1003.

In step S1003, executed as the second heating step, the single-crystal sapphire is heated in an atmosphere created by evacuating the air or by charging an inert gas so as to ensure that the number of oxygen molecules per unit volume in the atmosphere used for the second heating step is smaller than the number of oxygen molecules per unit volume in the atmosphere used for the first heating step. While no particular restrictions are imposed with regard to the type of inert gas in the atmosphere, the atmosphere may be created by using, for instance, helium, neon, argon or nitrogen. Once step S1003 is executed, the operation proceeds to step S1005.

In step S1005, the single-crystal sapphire is machined so as to optimize it for its purpose of use. For instance, a single-crystal sapphire to be used as a polarization element such as a wave plate needs to be machined into a flat plate with a thickness of, for instance, 1 μm through 1 mm. A single-crystal sapphire to be used as a substrate for a semiconductor device needs to be machined so as to achieve a thickness of 0.1 mm to several mm and a diameter of several cm to several tens of cm. A single-crystal sapphire to be used for a thermocouple protection tube, a crucible or a member in, for instance, a high-temperature furnace needs to be machined so as to achieve an optimal shape for the particular purpose of use. Once step S1005 is executed, the operation proceeds to step S1007.

It is to be noted that step S1005 and subsequent steps are executed only as needed and thus may be skipped in some cases.

In step S1007, an optical component such as a polarization element is assembled by using the single-crystal sapphire having been machined in step S1005.

It is to be noted that while the single-crystal sapphire first undergoes the first heating step and the second heating step before it is machined in the mode described above, a single-crystal sapphire may first be machined so as to achieve the desired shape corresponding to a specific optical component, and then the single-crystal sapphire having been machined may undergo the first heating step and the second heating step. In addition, the first heating step may be executed first, the single-crystal sapphire may then be machined to achieve a desired shape corresponding to a specific optical component, and then the machined single-crystal sapphire may undergo the second heating step. In other words, step S1005 may be executed prior to step S1001 or it may be executed after step S1001 but before S1003.

The following advantageous effects are achieved through the embodiment described above.

(1) The single-crystal sapphire obtained through the present embodiment achieves, at a thickness of 5 mm, an internal transmittance of 90% or higher, 95% or higher and/or 98% or higher for light having a wavelength of 193 nm. This means that an optical component with less optical loss can be achieved by taking advantage of the transmittance of the single-crystal sapphire for light having a wavelength of around 200 nm, and that the single-crystal sapphire can be particularly useful in an optical system in conjunction with which an excimer laser or the like is used.

(2) The single-crystal sapphire obtained through the present embodiment achieves, at a thickness of 5 mm, a wavelength $\lambda_{80}$ at which an internal transmittance becomes 80% at the absorption edge of the ultraviolet range for light is 170 nm or less and/or 150 nm or less. Thus, an optical component with less optical loss can be achieved by taking advantage of the transmittance of the single-crystal sapphire for light at wavelengths around 200 nm.

(3) The single-crystal sapphire obtained through the present embodiment achieves, at a thickness of 5 mm, an average internal transmittance of 85% or higher, 90% or higher and/or 95% or higher for light at wavelengths in the range of 150 nm through 220 nm. Thus, an optical component with less optical loss can be achieved by taking advantage of the transmittance of the single-crystal sapphire for light at wavelengths around 200 nm.

(4) The method for manufacturing a single-crystal sapphire achieved in the present embodiment comprises a first heating step in which a single-crystal sapphire is heated at a first temperature in an atmosphere containing oxygen and a second heating step in which the single-crystal sapphire, having been heated through the first heating step, is heated at the second temperature in an atmosphere with fewer oxygen molecules per unit volume compared to the number of oxygen molecules per unit volume contained in the atmosphere used for the first heating step. Thus, a single-crystal sapphire with less optical loss can be manufactured.

(5) In the method for manufacturing a single-crystal sapphire achieved in the present embodiment, the first heating step can be executed by setting the temperature at 1600° C. or higher and the second heating step can be executed by setting the temperature at 1600° C. or higher. In addition, the first heating step may be executed by setting the temperature at 1700° C. or higher and the second heating step may be executed by setting the temperature at 1800° C. or higher. Thus, a single-crystal sapphire can be manufactured with efficiency by reducing the duration of the heat treatment.

(6) In the method for manufacturing a single-crystal sapphire achieved in the present embodiment, the number of oxygen molecules per unit volume may be set equal to or smaller than $1.0 \times 10^{18}/m^3$ for the second heating step. As a result, oxygen having been introduced in excess into the single-crystal sapphire during the first heating step can be removed in an optimal manner.

(7) The optical component obtained by adopting the method for manufacturing a single-crystal sapphire achieved in the present embodiment can achieve a thickness of 0.5 mm or less and an internal transmittance of 99% or higher. This means that an optical component assuming the shape of a flat plate, such as a wave plate, which assures less optical loss, can be realized.

Example

A sapphire substrate 13 was manufactured by machining a sapphire ingot 11 having been manufactured through a method of the known art by setting a C plane as the principal plane. The sapphire substrate 13 was formed in the shape of a disk having a diameter of 60 mm and a thickness of 5 mm.

Figure 4:
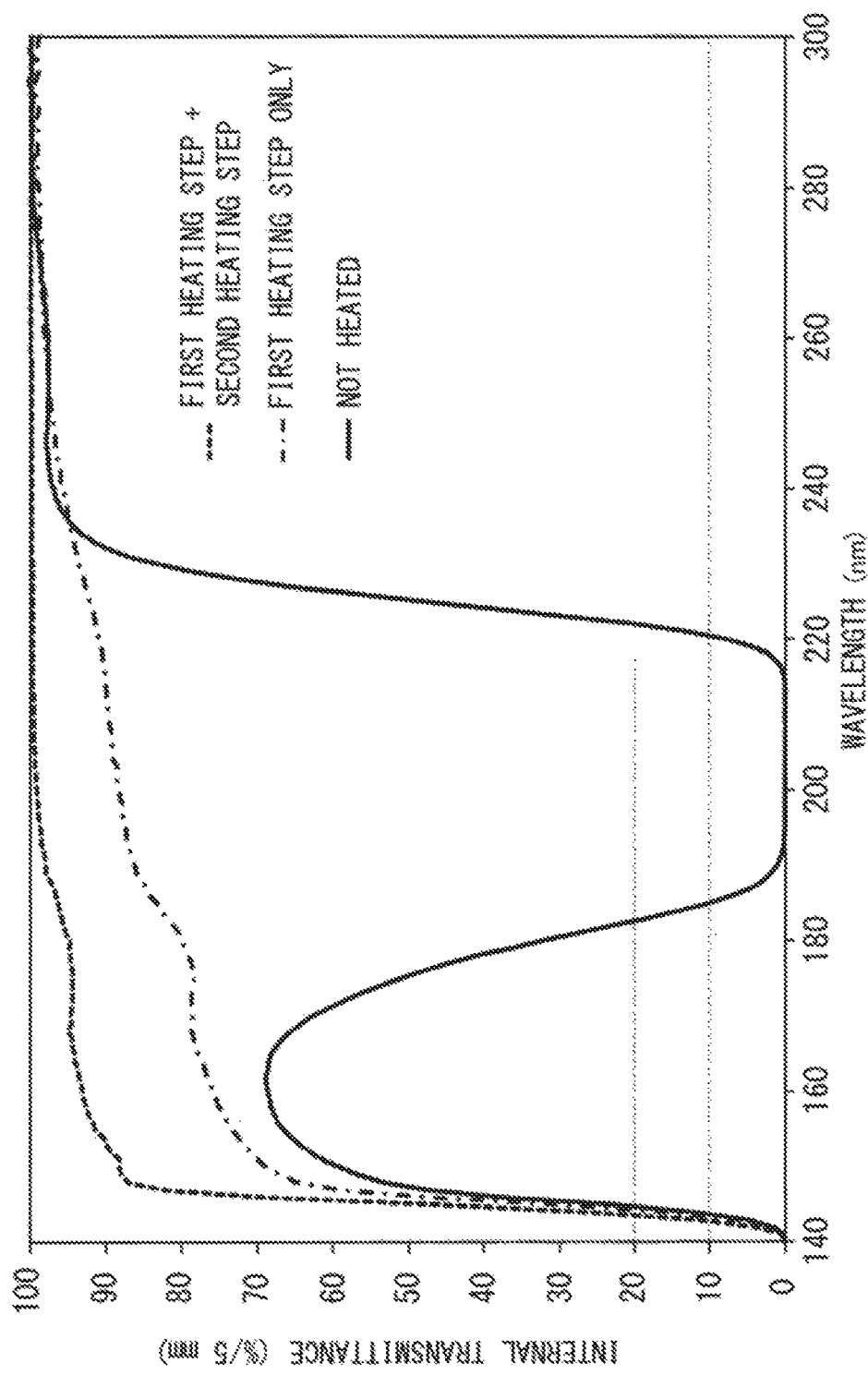
FIG. 4 is a diagram presenting a graph indicating the internal transmittance of the single-crystal sapphire achieved in the example.

The surface of the sapphire substrate 13 was polished in order to facilitate measurement of the internal transmittance of the sapphire substrate 13 to be carried out before and after it was heated. The results obtained by measuring the internal transmittance through spectrometry are represented by the solid line (notated as "unheated") in FIG. 4. FIG. 4 indicates that prior to the heat treatment, the sapphire substrate 13 had an absorption band for light at wavelengths around 200 nm. It was also confirmed that it assured a sufficiently high internal transmittance (99% or higher) for light at wavelengths in the range of 300 nm through 400 nm.

The sapphire substrate 13, having been polished, was placed in a high-temperature atmospheric furnace 20, where it underwent the first heating step through which it was heated in an atmosphere of room air. The heat treatment was executed with a holding temperature of 1800° C. for a retention time of 6 hours. The first heating step was executed in the atmospheric pressure and the number of oxygen molecules per unit volume and the partial pressure of oxygen at the holding temperature of 1800° C. were respectively calculated to $7 \times 10^{23}/m^3$ and $2 \times 10^4$ Pa.

Figure 3:
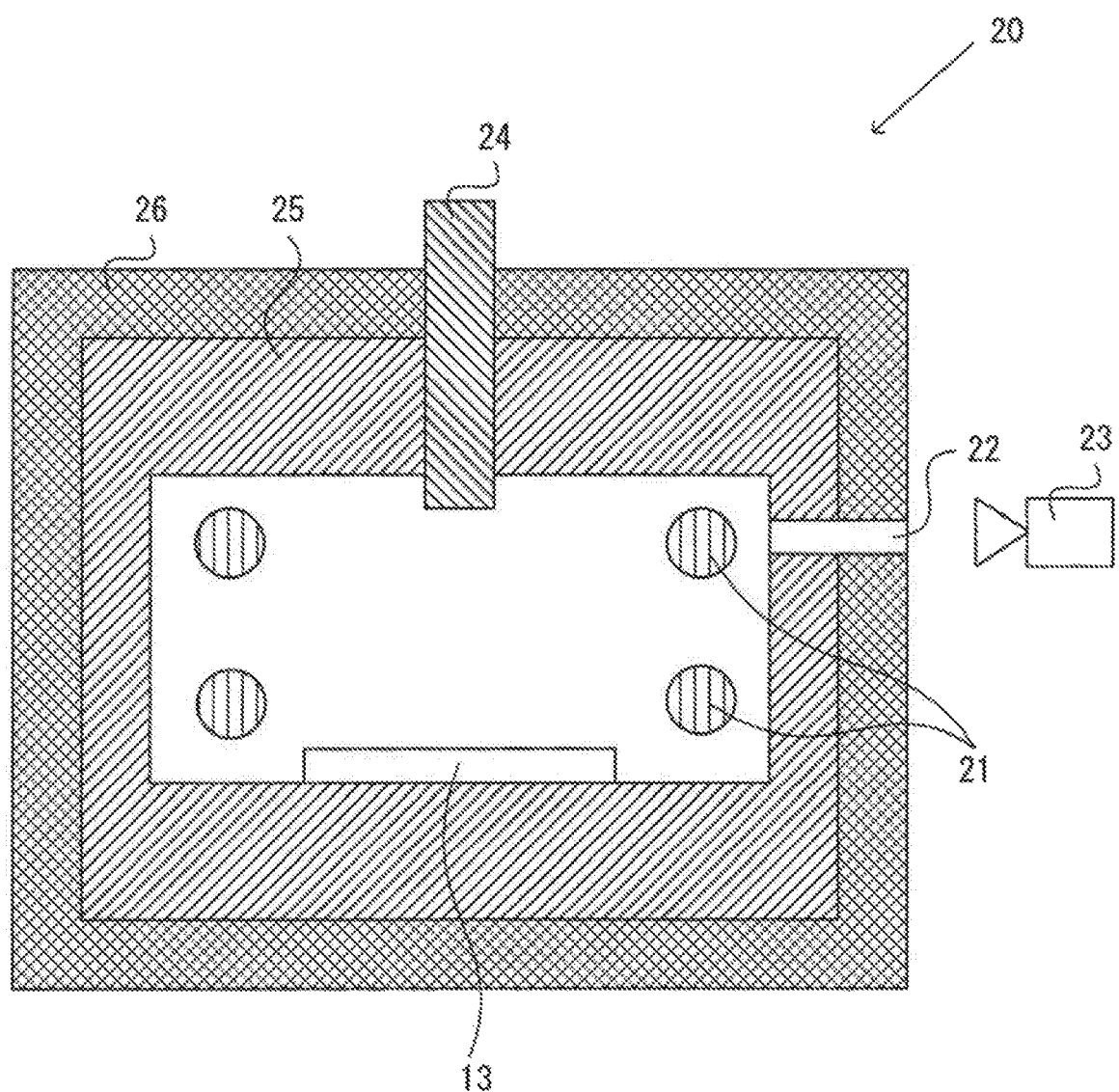
FIG. 3 is a sectional view of a furnace used in an example.

FIG. 3 is a sectional view of a high-temperature atmospheric furnace 20 used for the heat treatment (first heating step). The high-temperature atmospheric furnace 20 includes heaters 21, a window 22, a radiation thermometer 23, a thermocouple thermometer 24, a refractory member 25 and a support member 26. The sapphire substrate 13 was placed in the space inside the high-temperature atmospheric furnace 20. The temperature inside the furnace and the temperature of the sapphire substrate 13 were measured with the radiation thermometer 23 and the thermocouple thermometer 24. The thermocouple thermometer 24 may become damaged at high temperatures of approximately 1700° C. and higher. For this reason, the thermocouple thermometer 23 was placed at a position where the temperature was maintained at a level at which damage did not occur while the temperature inside the furnace, measured via the radiation thermometer 23, was approximately 1700° C. or higher.

Following the first heating step, the internal transmittance of the sapphire substrate 13 for light in the ultraviolet range was measured through spectrometry. The results are represented by the one-dot chain line (notated as "the first heating step only") in FIG. 4. FIG. 4 indicates that the absorption band for light at wavelengths around 200 nm, which had been present prior to the first heating step, disappeared. However, a visual observation of the sapphire substrate 13 revealed that haze, which had not been detected prior to the first heat treatment, was present.

Next, the sapphire substrate 13 was placed inside a high-temperature vacuum furnace (not shown) where it underwent a heat treatment (second heating step). The heat treatment was executed in an atmosphere created by evacuating the air so as to achieve a pressure of 0.1 Pa to $1 \times 10^{-4}$ Pa with the holding temperature controlled at 1950° C. for a retention time of 60 hours. The number of oxygen molecules per unit volume and the partial pressure of oxygen at the holding temperature of 1950° C. set for the second heating step were respectively calculated to be $7 \times 10^{14}$ to $7 \times 10^{17}/m^3$ and 0.02 to $2 \times 10^{-5}$ Pa.

While the high-temperature vacuum furnace mentioned above has a structure similar to that of the high-temperature atmospheric furnace 20, it further includes an evacuation port and a vacuum pump connected to the evacuation port and thus, the pressure inside the furnace can be held at 1 Pa or lower.

Following the second heating step, the internal transmittance of the sapphire substrate 13 was measured through spectrometry. The results are represented by the broken line (notated as "first heating step+second heating step") in FIG. 4. FIG. 4 indicates that the transmittance of light at wavelengths of approximately 140 nm through wavelengths of approximately 280 nm increased markedly, in comparison to the results of the measurement executed after the first heating step. In addition, it was confirmed that the haze that had been detected in the visual inspection conducted after the first heating step disappeared following the second heating step.

The results of the measurement of the internal transmittance and other items of the sapphire substrate 13, conducted at the various stages, i.e., prior to the first heating step, after the first heating step, and after the second heating step, presented in FIG. 4, are summarized in [Table 1]. [Table 1] indicates the internal transmittance of light at a wavelength of 193 nm, the wavelength $\lambda_{80}$ of light for which an internal transmittance of 80% was achieved at the absorption edge of the ultraviolet range, which rises around the wavelength of 140 nm, the average internal transmittance of light at wavelengths in the range of 150 nm through 220 nm, and the presence/absence of haze, all measured and observed at the sapphire substrate 13. It is to be noted that the average internal transmittance was calculated by arithmetically averaging the internal transmittances of light at wavelengths from 150 nm through 220 nm obtained in increments of 1 nm.

TABLE 1

|  | internal transmittance of light at wavelength 193 nm [%/5 mm] | $\lambda_{80}$ [nm] | average internal transmittance of light at wavelengths 150 nm through 220 nm [%/5 mm] | presence/absence of haze through visual inspection |
|---|---|---|---|---|
| example (first heating step + second heating step) | 98.5 | 147 | 96 | absent |
| comparison example 1 (first heating step only) | 87.2 | 180 | 83 | present |
| comparison example 2 (unheated) | 0.2 | 230 | 28 | absent |

The present invention is in no way limited to the particulars of the embodiment described earlier. Other modes conceivable within the scope of the technical teaching of the present invention are also within the scope of the present invention.

What is claimed is:

1. An optical component comprising aluminum oxide, the aluminum oxide providing, at a thickness of 5 mm, an internal transmittance of 95% or higher for light at a wavelength of 193 nm.

2. The optical component according to claim 1, wherein a wavelength $\lambda_{80}$ of light for which an internal transmittance of 80% is achieved at a thickness of 5 mm of the aluminum oxide is 170 nm or less.

3. The optical component according to claim 2, wherein the wavelength $\lambda_{80}$ is 150 nm or less.

4. The optical component according to claim 1, wherein the aluminum oxide provides, at a thickness of 5 mm, an average internal transmittance of light at wavelengths from 150 nm through 220 nm is 85% or higher.

5. The optical component according to claim 1, wherein a thickness of the aluminum oxide is 0.5 mm or less, and an internal transmittance of the aluminum oxide is 99% or higher for light with a wavelength of 193 nm.

6. The optical component according to claim 1, wherein the optical component is for transmitting light at a wavelength in a range of 150 nm through 220 nm.

7. An optical component comprising aluminum oxide, the aluminum oxide providing, at a thickness of 5 mm, an internal transmittance of 90% or higher for light at a wavelength of 193 nm, wherein
a wavelength $\lambda_{80}$ of light for which an internal transmittance of 80% is achieved at a thickness of 5 mm of the aluminum oxide is 170 nm or less.

8. The optical component according to claim 7, wherein the wavelength $\lambda_{80}$ is 150 nm or less.

9. The optical component according to claim 7, wherein the aluminum oxide provides, at a thickness of 5 mm, an average internal transmittance of light at wavelengths from 150 nm through 220 nm is 85% or higher.

10. The optical component according to claim 7, wherein the optical component is for transmitting light at a wavelength in a range of 150 nm through 220 nm.

11. An optical component comprising aluminum oxide, the aluminum oxide providing, at a thickness of 5 mm, an internal transmittance of 90% or higher for light at a wavelength of 193 nm, wherein
the aluminum oxide provides, at a thickness of 5 mm, an average internal transmittance of light at wavelengths from 150 nm through 220 nm is 85% or higher.

12. The optical component according to claim 11, wherein the average internal transmittance is 90% or higher.

13. The optical component according to claim 11, wherein the optical component is for transmitting light at a wavelength in a range of 150 nm through 220 nm.

14. An optical system for use with an excimer laser, comprising the optical component of claim 1.

* * * * *